(12) United States Patent
Wu

(10) Patent No.: US 8,752,980 B2
(45) Date of Patent: Jun. 17, 2014

(54) ILLUMINATION SYSTEM AND METHOD OF MANUFACTURING MULTI-CHIP PACKAGE STRUCTURE FOR LIGHT EMITTING DIODES

(75) Inventor: Yu-Chao Wu, New Taipei (TW)

(73) Assignee: Hong-Yuan Technology Co., Ltd., New Taipei (TW)

( * ) Notice: Subject to any disclaimer, the term of this patent is extended or adjusted under 35 U.S.C. 154(b) by 254 days.

(21) Appl. No.: 13/322,450

(22) PCT Filed: May 27, 2010

(86) PCT No.: PCT/CN2010/073323
§ 371 (c)(1),
(2), (4) Date: Nov. 23, 2011

(87) PCT Pub. No.: WO2010/135994
PCT Pub. Date: Dec. 2, 2010

(65) Prior Publication Data
US 2012/0069567 A1    Mar. 22, 2012

Related U.S. Application Data

(60) Provisional application No. 61/251,558, filed on Oct. 14, 2009, provisional application No. 61/181,616, filed on May 27, 2009.

(51) Int. Cl.
*F21V 7/22* (2006.01)
*F21V 29/00* (2006.01)
*H01L 33/48* (2010.01)

(52) U.S. Cl.
USPC .......... 362/235; 362/249.01; 438/27; 438/28; 257/E33.056

(58) Field of Classification Search
None
See application file for complete search history.

(56) References Cited

U.S. PATENT DOCUMENTS

| 7,520,629 | B2* | 4/2009 | Johnson et al. | 362/103 |
| 2002/0006040 | A1* | 1/2002 | Kamada et al. | 362/237 |
| 2005/0276052 | A1* | 12/2005 | Shimada et al. | 362/294 |
| 2007/0064450 | A1* | 3/2007 | Chiba et al. | 362/655 |
| 2007/0217210 | A1* | 9/2007 | Jeong et al. | 362/428 |
| 2010/0067224 | A1* | 3/2010 | Wu | 362/235 |

FOREIGN PATENT DOCUMENTS

| CN | 1214208 | 8/2005 |
| CN | 200982582 | 11/2007 |
| CN | 201069109 | 6/2008 |
| CN | 201100540 | 8/2008 |
| CN | 100456473 | 1/2009 |
| CN | 100463242 | 2/2009 |
| WO | 2008058446 | 5/2008 |

* cited by examiner

*Primary Examiner* — Ashok Patel
(74) *Attorney, Agent, or Firm* — Liu & Liu

(57) ABSTRACT

One embodiment of the invention provides an illumination system including a light-source supporting body and a power supporting body. The light-source supporting body has a first groove. At least a light-source module is received in the first groove. The power supporting body has second groove. At least a power module is received in the second groove. The light-source supporting body is detachably fixed on the power supporting body. Each light-source module includes a multi-chip package structure composed of a plurality of light-emitting chips, and each of the light-source modules and the power module are separated by the light-source supporting body and the power supporting body.

12 Claims, 13 Drawing Sheets

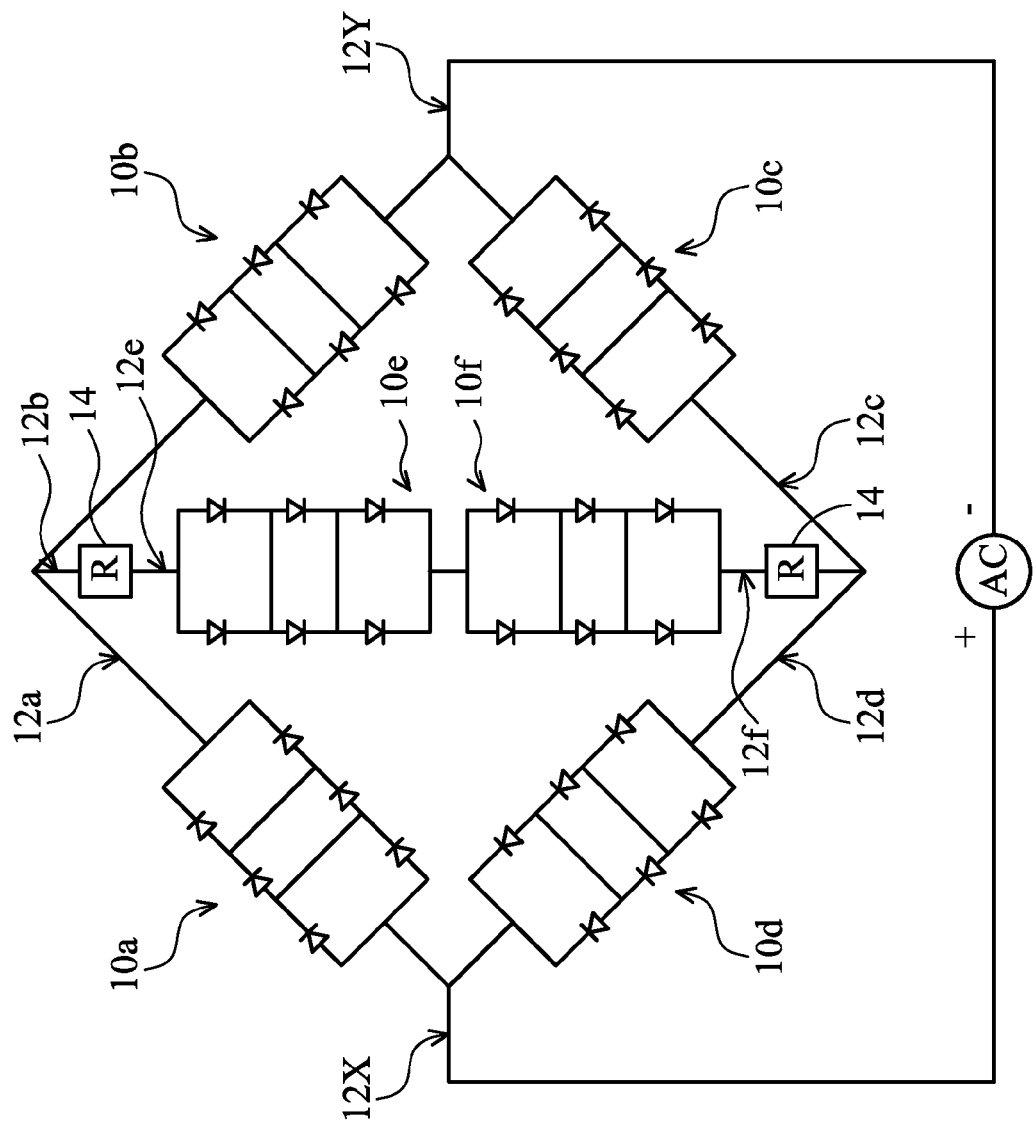

US 8,752,980 B2

ILLUMINATION SYSTEM AND METHOD OF MANUFACTURING MULTI-CHIP PACKAGE STRUCTURE FOR LIGHT EMITTING DIODES

TECHNICAL FIELD

The present invention relates to a lamp system, and more particularly to an illumination system having a plurality of light-source modules.

BACKGROUND ART

A light emitting diode (the abbreviation thereof is LED) has many advantages, such as high brightness, a small size, a light weight, durability, low power consumption, and a long useful life. Therefore, light emitting diodes are widely used in many kinds of display products. The light emitting principle of the light emitting diode is described as follows. A voltage can be applied to a diode to drive the combination of an electron and a hole in the diode. The energy generated by the combination may be released in the form of light. In addition, the wavelength and strength of a light (color) may be adjusted by adding phosphors to the structure of the light emitting diode.

Following the invention of white light emitting diodes, light emitting diodes have been applied to the illumination field. Compared with the incandescent light bulb and the daylight lamp, which are widely used for illumination, the white light emitting diode has advantages, such as having a low heating value, lower power consumption, a longer useful life, a higher reaction rate, and a smaller size, etc. Therefore, the light emitting diode was a major development in the illumination industry.

However, conventional illumination systems made with light-emitting diode light-source modules are usually integrally formed. Thus, it is not easy to install or uninstall the illumination systems, and difficulty for maintaining the illumination systems is increased. Also, for the conventional illumination system, the power, light source, and heat source are usually integrated, instead of being separated, thus, weakening heat dissipation. Therefore, malfunction rate of the illumination system may increase because of heat stack. As a result, a novel and improved illumination system is needed.

SUMMARY OF THE INVENTION

Accordingly, one embodiment of the invention provides an illumination system including a light-source supporting body and a power supporting body. The light-source supporting body has a first groove. At least a light-source module is received in the first groove. The power supporting body has a second groove. At least a power module is received in the second groove. The light-source supporting body is detachably fixed on the power supporting body. Each light-source module includes a multichip package structure composed of a plurality of light-emitting chips, and each of the light-source modules and the power module are separated by the light-source supporting body and the power supporting body.

To further make the above and other objectives, features, and advantages of the invention more understandable, preferred embodiments of the invention are detailed below with reference to the attached figures.

DESCRIPTION OF THE DRAWINGS

FIG. 2C is an equivalent circuit diagram illustrating the embodiment in FIG. 2B;

Figure 1A:
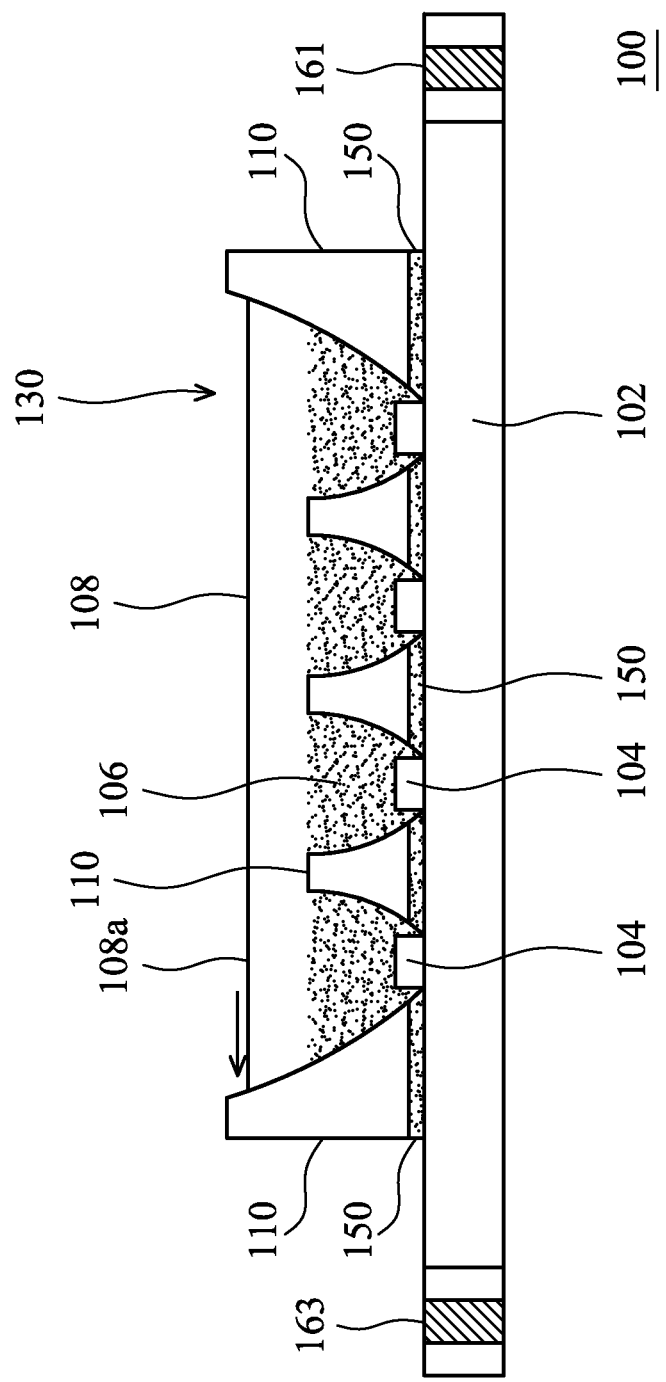
FIG. 1A is a partial cross-sectional view illustrating an embodiment of a multichip package structure.

BRIEF DESCRIPTION OF REFERENCE NUMERALS IN THE DRAWINGS light-emitting diode module 100; carrying substrate 102; light-emitting diode chip 104; light-emitting row 130; reflector 110; luminous material layer 106; inner covering layer 108; interface 108a; lens 600; adhesive agent 150; light-emitting row 130a, 130b; light-emitting chip 104a, 104b; side surface 124a, 124b; light-emitting chip 104c; control chip 140; light-emitting chip 22a; matrix array 22; carrying plate 20; power electrodes 12X, 12Y, 20X, 20Y; conductive pattern 20a to 20g, 12a to 12f; matrix array 10a to 10f; variable resistor 14; illuminating equipment 500; light-source supporting body 540; power supporting body 514; groove 542; light-source module 560; flat glass shell 580; arc glass shell 585; groove 516; power module 518; terminal portion 510; tube element 512; dissipation fin 550; ventilator 570; top cap 572; communicating tube 575; ventilation hole 577; screwed locking device 576; baffle plate 578; waterproof and ventilating layer 574; dissipation plate 520; ventilator 530.

DETAILED DESCRIPTION OF THE INVENTION

The embodiments claim the contents of the inventor's U.S. Provisional Application No. 61/181,616, which are incorporated herein by reference.

In the following embodiments of the present invention, a multichip package structure, a light-source module, and an illumination system composed of a plurality of independent light-source modules are described, respectively. However, the embodiments are used only to explain the invention, but not to restrict the scope of the invention.

A Multichip Package Structure having Reflectors

FIG. 1A illustrates a multichip package structure having reflectors. The multichip package structure 100 includes a shared carrying substrate 102 to carry a plurality of light-emitting chips 104, such as light emitting diodes (LEDs). In this embodiment, the light-emitting diode chips are in the space surrounded by the reflectors 110, as shown in the FIGS. 1B and 1C, and are disposed on the carrying substrate 102. As shown in the FIG. 1B, light-emitting rows 130a and 130b are disposed in a row space formed by two reflectors 110. As shown in the FIG. 1C, the light-emitting rows 130a and 130b are disposed in the same space surrounded by the reflectors 110.

Also, in one embodiment, a luminous material layer 106, made from fluorescent particle material, for example, may be extended to the inner walls of the reflectors, and the light-emitting chips 104 may be covered by the luminous material layer 106. In a specific embodiment, at least one portion of the luminous material layer 106 can be fluorescent particles, which are condensed to a mass and are without an adhesive agent. For example, the fluorescent particles are condensed to a mass by Van der Waals' force bonds, which are formed by heat drying. In this embodiment, a top surface and a side surface of each light-emitting chip 104 in the same row may be completely covered by the fluorescent particle layer 106. In another embodiment, the Light-emitting diode module further includes an inner covering layer 108, covering the luminous material layer 106, as a protective layer, such as a glass cement or an epoxide resin layer.

In one embodiment, the inner covering layer 108 and the luminous material layer 106 may be integrated as a single fluorescent particle layer, which includes a protective adhesive, which is mixed with the fluorescent particles.

In another embodiment, the inner covering layer 108 includes the fluorescent particles to increase luminous efficiency. In this embodiment, the distribution density of the fluorescent particles in the inner covering layer 108 may be lower than that of the luminous material layer 106.

The top surface of the inner covering layer or the single fluorescent particle layer may be lower than the top edge of the reflector. In a preferred embodiment, the top surface may be extended to the inner walls of the reflectors. Therefore, when the light generated by the light-emitting chips transversely scatters along an interface 108a, the luminous efficiency of the multichip package structure 100 may be improved by redirecting the light via the side walls of the reflectors.

The shape of the area surrounded by the reflectors 110 can be a polygon-like shape, such as a rectangle or a pentagon shape, and can also be a circular or an elliptic shape.

Since the direction of the light emitted by the light-emitting chips 104 may be adjusted by the reflectors 110, by methods such as sheltering, reflecting, gathering or focusing, when the sides of the light-emitting chips are not fully covered by the luminous material layer 106, the light leakage from the sides of the light-emitting chip 104 is hindered, thus, diminishing color offset problems.

In general, the reflector 110 is made from metal material having a reflective surface. Alternatively, the reflector 110 can be a plastic body having a reflective material layer disposed on the surface thereof. For example, a reflective material, such as chrome, nickel, silver, zinc fluoride, or magnesium sulfide, may be electroplated on the surface of the plastic body.

Nonetheless, when the illumination system is disposed outdoors, such as for use as a road lamp, and when the reflector is made from metal materials, the reflector may be eroded or oxidized, or a matte surface may easily form on the reflector, because of moisture, dust or pollution found outdoors. Accordingly, if occurring, light-reflecting effect of the reflector would be influenced. Moreover, because metal expands and shrinks due to large temperature changes, the structure of an illumination system outdoors may be easily damaged. Therefore, in one embodiment, the main body of the reflector is made from a ceramic body. Enamel is coated on the surface of the ceramic body by a high temperature process at 800 to 1200 degrees to form a reflective surface. Next, the reflective surface is fixed on the carrying substrate with adhesive agents. Next, the light-emitting chips are mounted on the carrying substrate, and are surrounded by the reflectors, as described in the above embodiment.

Because the enamel is a material comprising silicate, the enamel may form a glassy state thin layer on the surface of the ceramic body by high temperature processes. The chemical characteristic of acid and alkali resistance, of the enamel is better than ordinary metal, such as aluminum and iron. The mechanical strength, thermal stability, dielectric strength of the ceramic body may also be improved by the enamel. The enamel may also prevent the ceramic body from eroding due to liquids or gases or adhering of dust. Because in the embodiment, the reflector has a ceramic body having the enamel surface, the reflector has the advantages of good heat-dissipation, structural strength, and smoothness of the reflective surface thereof.

The Interface Between the Reflectors and the Carrying Substrate

Please refer to the multichip package structure shown in the FIG. 1A. In this embodiment, a bottom of the reflector 110 is connected to the carrying substrate 102 by the adhesive agent 150. However, the adhesive agent 150 has a predetermined height after the adhesive agent 150 is solidified. Therefore, part of the side light emitted by the light-emitting chips 104 will pass through the interface between the reflector 110 and the carrying substrate 102. Note that no matter whether the adhesive agent is made from transparent resin or opaque resin, light passing through the interface between the reflector 110 and the carrying substrate 102 will not be reflected by the reflector. Accordingly, in this case, the luminous efficiency of the light-emitting row may be decreased.

In this embodiment, a plurality of illuminating particles, such as fluorescent particles, are mixed in the adhesive agent 150 made from transparent resin. Therefore, the side light passing through the interface between the reflector 110 and the carrying substrate 102 may excite the illuminating particles in the adhesive agent to generate light. Next, the light generated by the illuminating particles may be emitted into the light-emitting row, thus improving luminous efficiency.

Arrangement of the Light-Emitting Chips

Please refer again to FIGS. 1B and 1C, which show the arrangement of the light-emitting row having a plurality of light-emitting chips. Since the side surfaces of each of the light-emitting chips may block the light emitted from the side surfaces of other light-emitting chips, which decreases luminous efficiency, this embodiment discloses a specific arrangement for the light-emitting chips to mitigate this problem.

For example, the light-emitting row 130b includes a plurality of unpackaged bare chips, such as the light-emitting chips 104a and 104b, which are carried on the substrate 102. The side wall of the reflector 110 includes a reflective surface to reflect a light L emitted by the light-emitting chips. Also, the shape of the light-emitting chips is a polygon shape, such as a tetragon or a hexagon shape. The shape of the light-emitting chip depends on the cut technology of the chip.

Regarding the relationship between the light-emitting chips and reflectors, in one embodiment, when the more a straight light L emitted by the side surfaces of the light-emitting chip substantially toward the side walls of the reflectors or toward the side walls of the reflectors at an inclination angle is not blocked by other light-emitting chips, the greater the luminous efficiency is. As shown in the FIG. 1B, the distance between the adjacent chips 104a and 104b is distance P. For example, the distance P is the distance between the ends of the two chips. The luminous efficiency may be increased when the light-emitting chips are arranged in a rhomboidal shape with a proper distance, or when the straight light emitted by each of the side surfaces of two adjacent chips is substantially emitted to the side walls of the reflectors or emitted to the side walls of the reflectors at an inclination angle.

In another embodiment, the shape of the space surrounded by the reflector is a circular shape or a ring shape, because each of the light-emitting chips includes a diagonal line which extends from the two ends thereof, such that the light-emitting chips may be arranged in a row along the diagonal line which is parallel to the side wall or the axle of the reflector 110.

With the arrangement of the light-emitting chips, a straight light emitted by the side surfaces of the light-emitting chips may be guided more efficiently to substantially be emitted to the reflective surfaces in the side walls of the reflector not blocked by other light-emitting chips. Therefore, luminous efficiency may be improved.

Figure 1B:
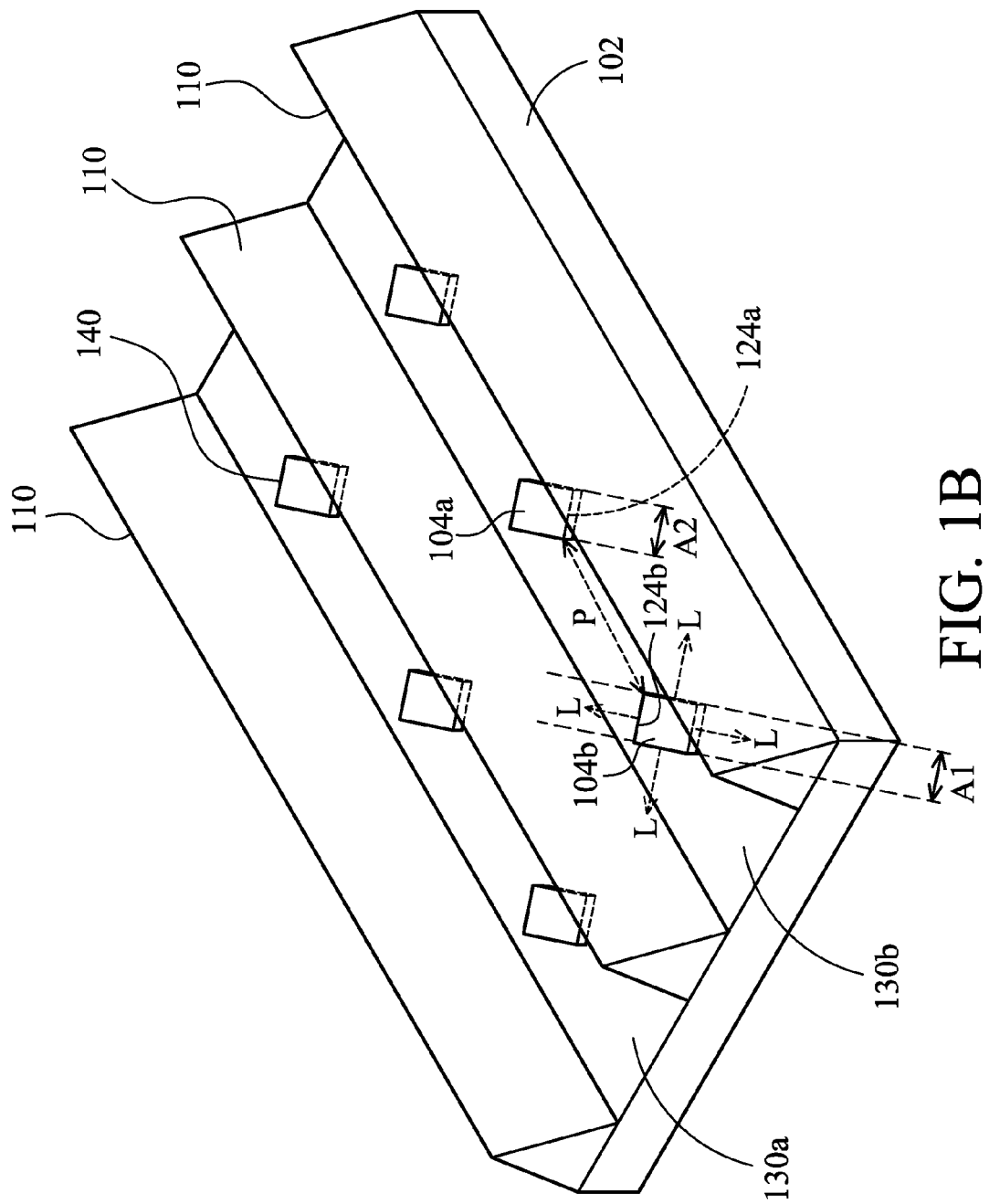
FIGS. 1B and 1C illustrate an arrangement of light-emitting chips according to the multichip package structure in FIG. 1A.
Figure 1C:
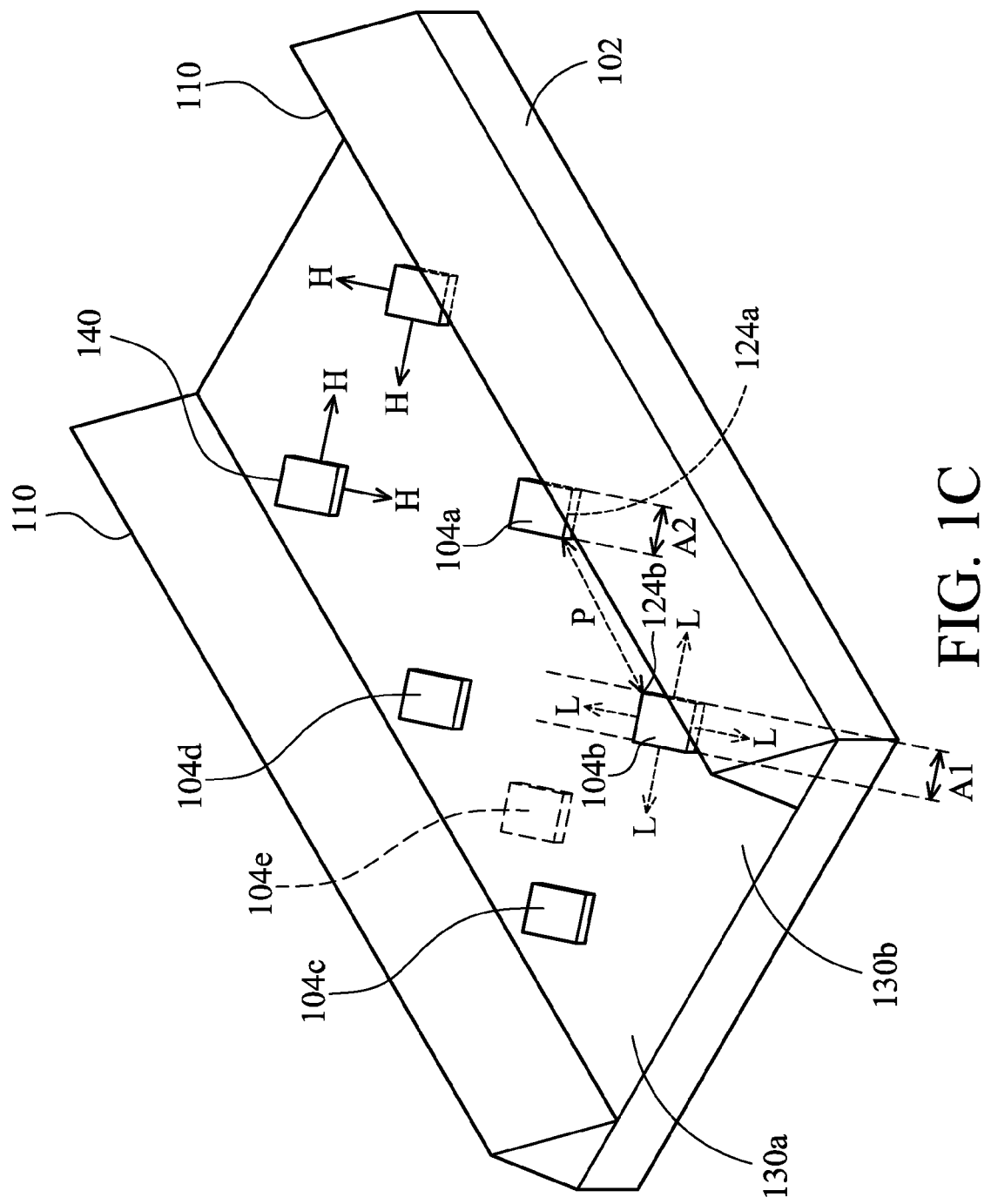

Please refer to FIG. 1C, in another embodiment, in order to further reduce the area of the substrate 102, or to increase the arrangement density of the light-emitting chips, or to improve a luminescent intensity of a specific light-emitting row, for a permitted dissipating condition that the straight light emitted by the light-emitting chips is not completely blocked by other light-emitting chips, many rows of the light-emitting chips 130a and 130b may be disposed in a space surrounded by the reflectors 110 according to the above principle. The described arrangement may be combined with a misalignment method to make the light emitted by the side surfaces of the light-emitting chips of two adjacent rows, such as between the light-emitting chip 104e and the light-emitting chips 104a and 104b, not be blocked by each other to reach the reflector.

In another embodiment, as shown in the FIGS. 1B and 1C, the multichip package structure further includes a control chip 140, such as a driver IC or a power management chip. These chips are semiconductor chips without a luminous function. However, since the light-emitting chips 104 and the control chip 140 both generate high thermal radiation H when operated, if the chips are packaged in the conventional manner, the thermal radiation H will be increased easily in an enclosed space formed by the adjacent side walls of the light-emitting chip 104 and the control chip 140, and will not be dissipated. This is not advantageous for heat dissipation. In order to prevent this situation from occurring, the semiconductor chip 140 without the luminous function and the light-emitting chips 104 may be arranged in a specific manner, such as in a rhomboidal shape, to solve the problem of heat stack. Therefore, the semiconductor chips and the light-emitting chips may be packaged in the same package structure at the same time.

Light-Source Module

Also, a lens (not shown) may be disposed on the light-emitting rows. The carrying substrate 102, the light-emitting chip 104, the protective layer 108, and the reflectors 110 of the multichip package structure 100 are covered by the lens to adjust the light of the light-emitting row and to form a light-source module. In one embodiment, the lens may be sealed on the frame of the carrying substrate or the reflector to form an enclosed chamber. The inner portion of the enclosed chamber is a vacuum environment or is full of inert gas to maintain stability of the enclosed chamber.

Also, in other embodiments, the shape of the reflector 110 may be respectively changed. For example, the cross-sectional shape of the reflector 110 can be a trapezoid, a triangle or an arc. In other embodiments, the shape of the area surrounded by the reflector can be any shape. For example, a stripe reflector may be made to match the shape in a backlight module.

Circuit Design of the Multichip Package Structure

Figure 2A:
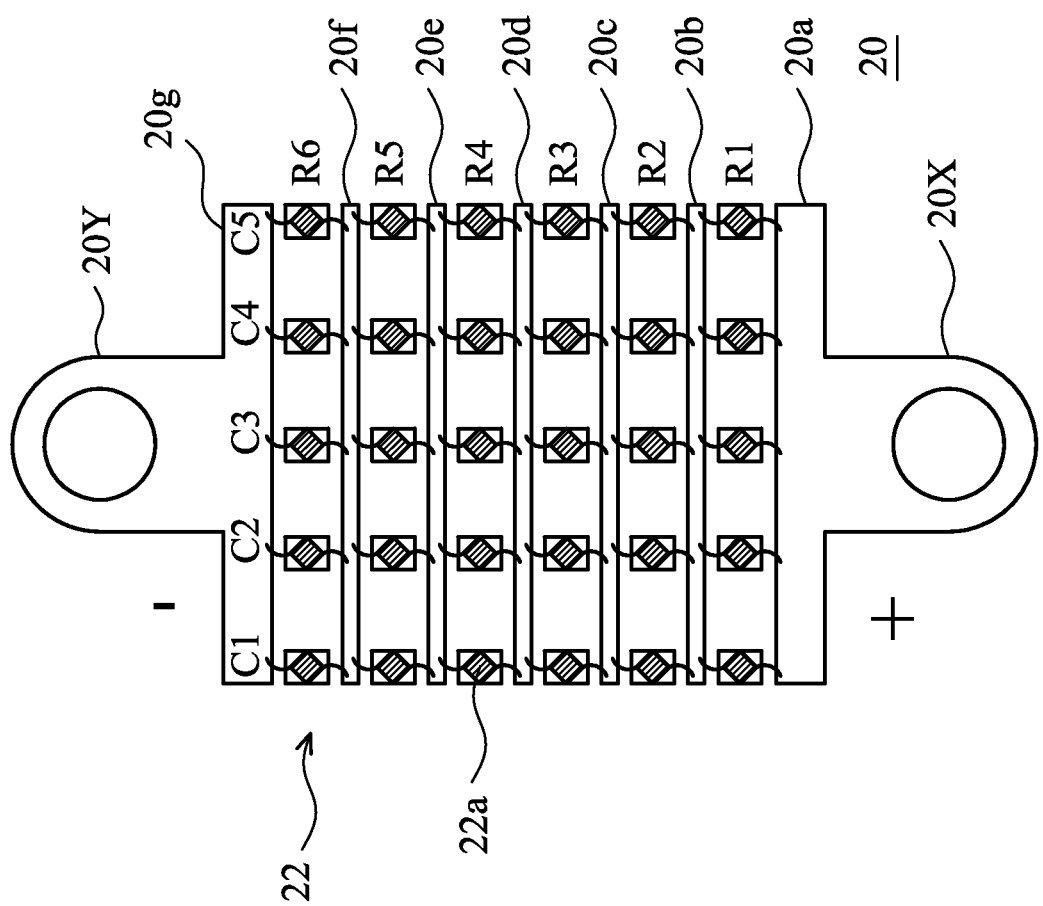
FIG. 2A illustrates an arrangement and electrical connections of light-emitting chips of a light-emitting matrix in an embodiment of a multichip package structure of a direct current power type.

Please refer to FIG. 2A, which illustrates the circuit of the multichip package structure. The embodiment uses direct current power for example. Each of the light-emitting chips 22a is arranged in specific arrangements, such as in a rhomboidal shape to form a matrix array 22 on a carrying plate 20. The carrying plate 20 can be a semiconductor substrate, such as a circuit plate, a metal plate, an alumina substrate, or a silicon substrate. In this embodiment, the light-emitting chips in the array 22 may be arranged in five columns (C1 to C5) and six rows (R1 to R6). The positive electrode and the negative electrode of the light-emitting chip are disposed on the top surface (light-emitting surface), but the positions of the electrodes of the light-emitting chip are not limited thereto. A plurality of conductive patterns made by copper foil, silver plasma or an aluminum wire, etc is formed on a surface of the carrying plate 20. In this embodiment, the carrying plate 20 includes a power positive electrode 20X and a power negative electrode 20Y. It is noteworthy that the positive or negative electrodes of the light-emitting chips in the same column, such as (C1, R1) to (C1, R6) are electrically connected via the wire patterns 20a to 20g in series. The positive or negative electrodes of the light-emitting chips in the same row, such as (C1, R1) to (C5, R1) are electrically connected via wire patterns 20a and 20g in parallel. According to experiments, due to the circuit structure, the probability of light-emitting chips burning out by unstable voltage is decreased. Also, even if a single light-emitting chip burns out, the other light-emitting chips in the same column will still generate light.

Figure 2B:
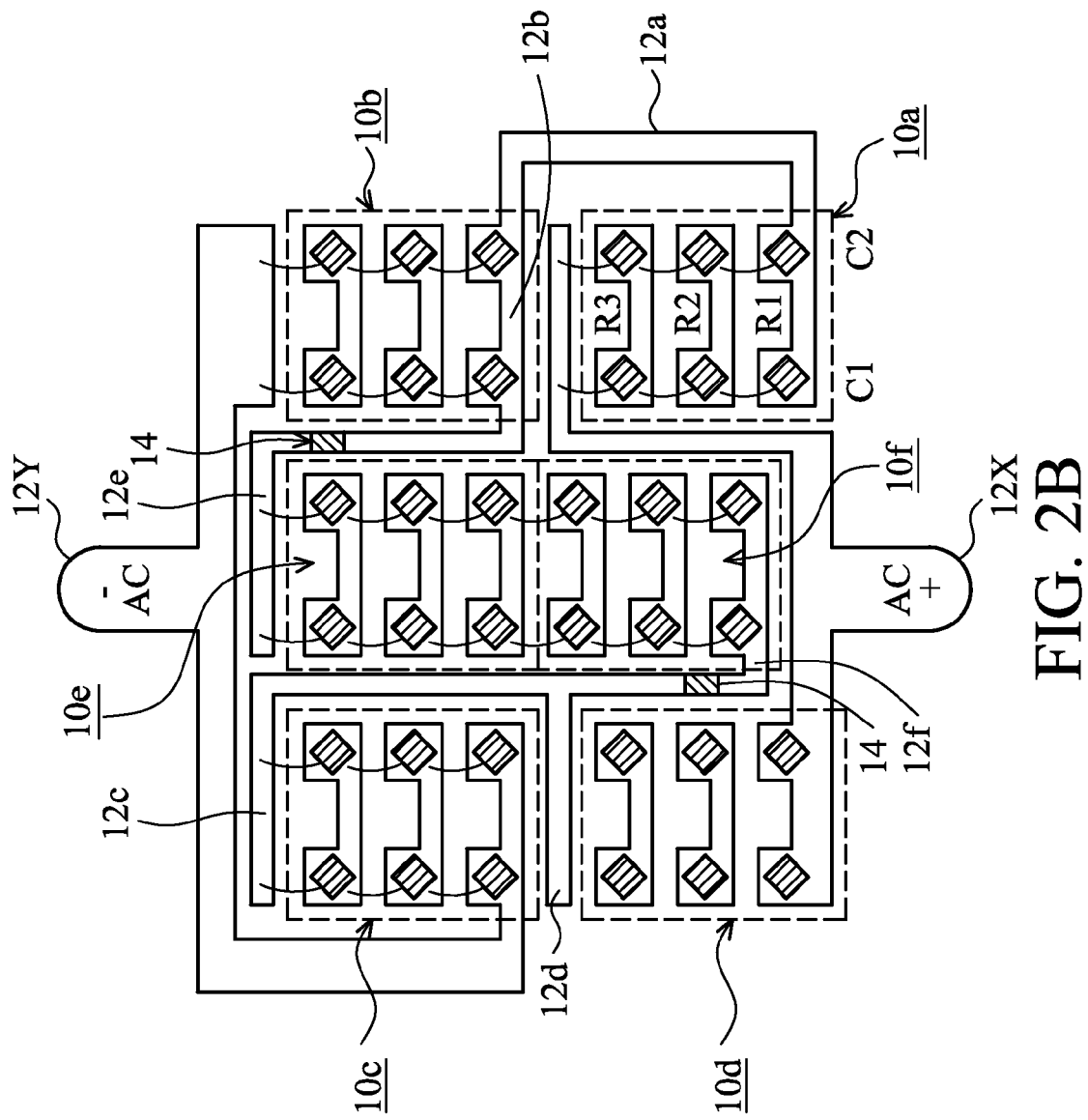
FIG. 2B illustrates an arrangement and electrical connections of light-emitting chips of a plurality of light-emitting matrixes in an embodiment of a multichip package structure of an alternating current power type.

Please refer to FIG. 2B, which illustrates the circuit of the multichip package structure of the alternating current power type. FIG. 2C shows an equivalent circuit diagram of FIG. 2B. The multichip package structure of the alternating current power type in this embodiment includes a plurality of light-emitting elements. Each of the light-emitting elements includes an array assembled by a plurality of light-emitting chips. For example, each of the light-emitting elements 10a, 10b, 10c, 10d, 10e, and 10f is disposed on the carrying plate and forms an alternating circuit by electrically connecting to each other, such as the bridge circuit shown in the FIG. 2C. The positive electrode of the light-emitting chip in this embodiment is located on the top surface thereof (light-emitting surface). The negative electrode is located on the bottom surface of the light-emitting chip. In one embodiment, each of the light-emitting chips may be arranged in a rhomboidal shape to form many matrix arrays 10a to 10f on the carrying plate. The carrying plate includes two power electrodes, 12X and 12Y, and the wire patterns 12a, 12b, 12c, 12d, 12e, and 12f electrically connected to each of the light-emitting elements 10a, 10b, 10c, 10d, 10e, and 10f to form the bridge alternating circuit.

It is noteworthy that, as the above embodiment, each of the light-emitting elements is arranged in an array. As illustrated in the matrix 10a, the light-emitting chips may be arranged in two columns (C1 to C2) and three rows (R1 to R3). The positive electrode and the negative electrode of the light-emitting chips are located on the top surface (light-emitting surface) and the bottom surface thereof, respectively. The positive and negative electrodes of the light-emitting chips in the same column, such as (C1, R1) to (C1, R3), are electrically connected in series. The positive and negative electrodes of the light-emitting chips in the same row, such as (C1, R1) to (C2, R1), are electrically connected in parallel. Please refer to the equivalent circuit in FIG. 2C. In the positive half cycle of the alternating current, the positive voltage is supplied by the power electrode 12X. The light-emitting matrixes 10a, 10e, 10f, and 10c emit light by the current passing therethrough. In the negative half cycle of the alternating current, the positive voltage is supplied by the power electrode 12Y. The light-emitting matrixes 10b, 10e, 10f, and 10d emit light by the current passing therethrough. Therefore, the light-emitting matrixes 10e and 10f may continuously emit light.

The circuit structure described above, including the positive and negative electrodes of the multichips connected in series or parallel, can be applied by alternating current power. However, voltage of alternating current power is supplied unstably sometimes. In general, the voltage is variable in a range of 10 to 20 voltages. Therefore, the light-emitting dies may burn out easily. The series and parallel structure in this embodiment can mitigate the voltage variations and thus decrease the chance of the light-emitting chip burning out.

To adjust the voltage drop between the full-time light-emitting matrixes 10e and 10f, passive elements may be added to two ends of the light-emitting matrixes 10e and 10f. For example, a variable resistor 14 may be adjusted corresponding to alternate current power voltage. Also, a capacitor, an inductance, a filter component, or a stabilizing component can also be a part of the circuit.

In this embodiment, regarding the light-emitting elements in FIGS. 2A and 2B, each of the light-emitting chips may be arranged according to FIG. 1B or FIG. 1C and surrounded by the reflector. For example, in FIG. 2B, the light-emitting chips of each of the light-emitting elements 10a to 10f in each of the rows and columns may be aligned to each other. The chips belonging to different light-emitting elements in each of the two rows may be surrounded by the same reflector. The light generated by the side surfaces of the light-emitting chip is not blocked by each other. Therefore, the luminous efficiency may be improved, and thermal radiation between two chips will not be increased.

Figure 3:
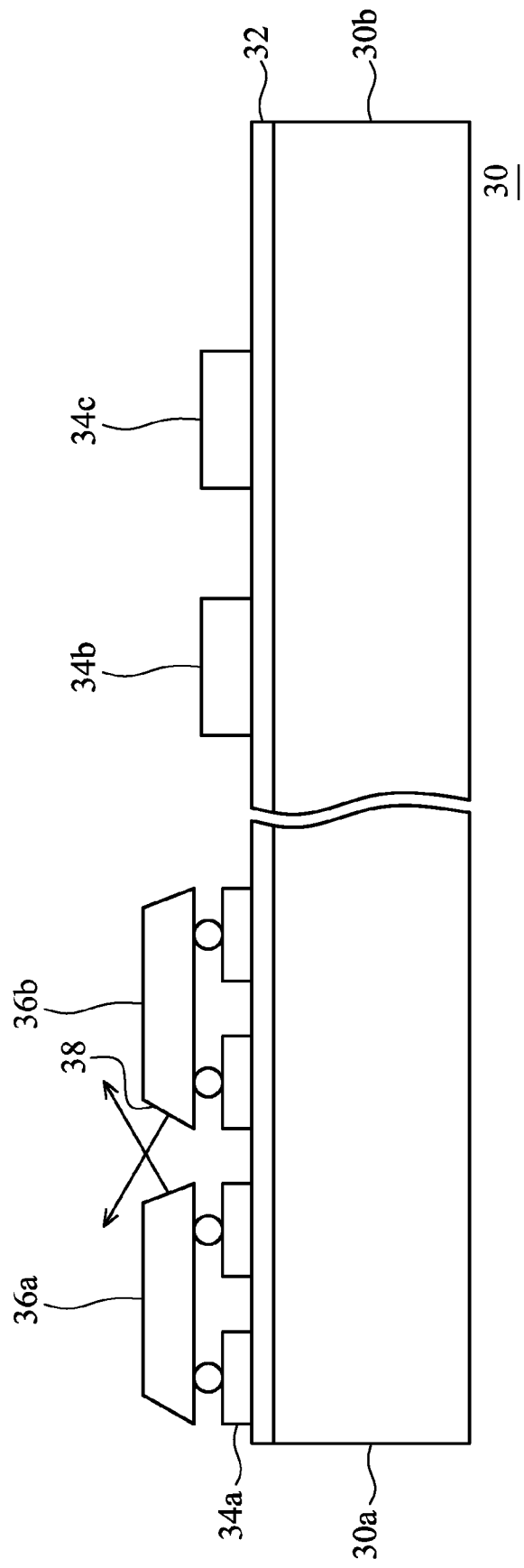
FIG. 3 illustrates an embodiment of the multichip package structures in FIGS. 2A to 2C made by a semiconductor process.

Please refer to another embodiment as shown in the FIG. 3, wherein the multichip package structure is made by a semiconductor process. First, a carrying plate is provided, such as a silicon substrate 30. The carrying plate includes a light-emitting chip carrying section 30a and a passive component carrying section 30b. Next, an insulation layer 32 is formed on the silicon substrate 30. Then, a patterned conducting layer, such as a metal layer made from silver, aluminum or copper, is formed as a wire pattern 34a, such as the wire pattern corresponding to FIG. 2A or FIG. 2B. At the same time, the passive components 34b and 34c may be attached on the passive component carrying section 30b of the silicon substrate, and a plurality of passive components may be formed by the semiconductor process and include passive components such as a capacitor, a resistor, an inductance, a filter component, or a stabilizing component. The wire pattern 34a and conducting layer needed by the passive elements 34b and 34c may be made at the same time, but is not limited thereto.

Next, each of the light-emitting chips 36a and 36b may be chosen to be arranged according to the above arrangement and be electrically connected to the wire pattern 34a by a flip chip process to form a matrix of direct current power type or alternating current power type. Also, in another embodiment, the side walls of two adjacent light-emitting chips may be processed before the package process. For example, an upward inclined plane 38 may be formed by a diamond knife or laser cutting the edge of the light-emitting chip. Therefore, light will not be blocked from the adjacent chips, and heat will not increase easily between the two chips.

Figure 4:
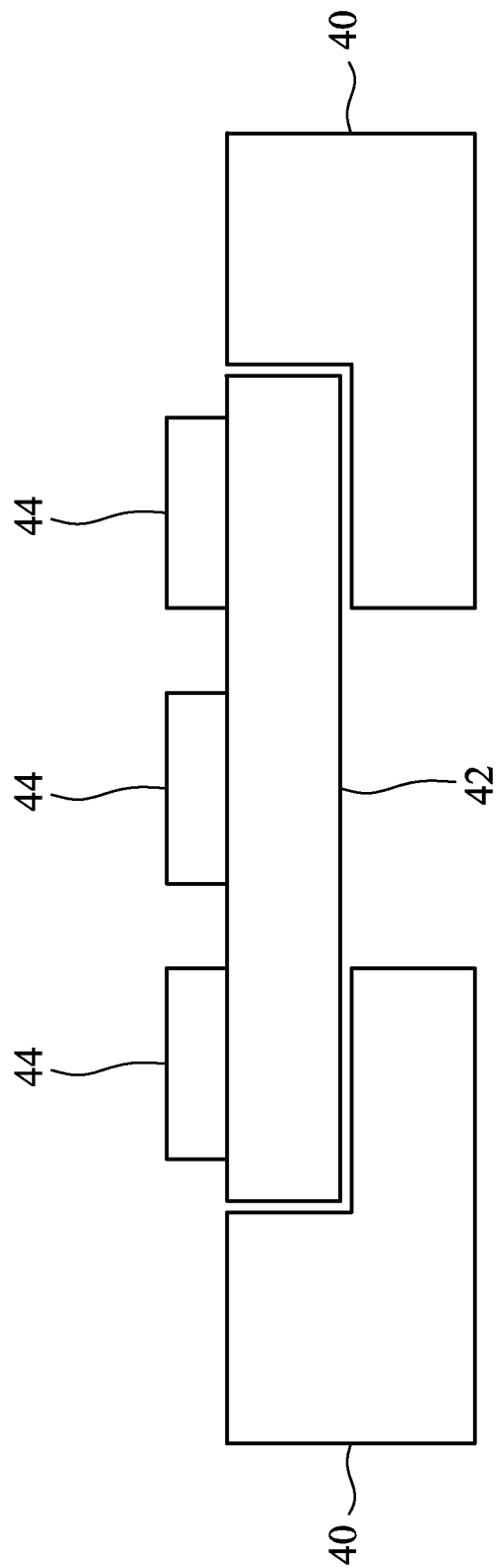
FIG. 4 illustrates an embodiment of a plurality of composite carrying plates having different thermal conductivities.

Please refer to FIG. 4, in another embodiment, a high thermal element and a low thermal element may be disposed on a carrying plate with different thermal conductivities. For example, an alumina substrate or a silicon substrate 42 may be embedded in the printed circuit board 40. Then, the high thermal element 44, such as a capacitor, is disposed on the carrying plate having higher thermal conductivity, such as the alumina substrate or the silicon substrate 42. The low thermal element (not shown in the figures) is disposed on the carrying plate having lower thermal conductivity, such as a printed circuit board 40. Because the two carrying plates 40, 42 form an interface, the heat flow of the carrying plate carrying the high thermal element may be dissipated quickly, and the heat flow will not flow back to the carrying plate, which carries the low thermal element.

Illuminating Equipment

Please refer to the illuminating equipment shown in the FIGS. 5A-5E. The illuminating equipment 500 in this embodiment is an illumination system having a plurality of independent light-source modules, for example an outdoor lamp such as a road lamp, a search lamp, an art lamp, or a mood lamp. The illuminating equipment 500 includes a light-source supporting body 540 and a power supporting body 514. The light-source supporting body 540 and the power supporting body 514 may be detachably assembled together. The material of the supporting body is composed of, for example, a metal body having a dissipating function, having a certain strength, like aluminum, copper or alloy of the aluminum and copper. The light-source supporting body 540 has a groove 542. A plurality of light-source modules 560 in each of the above embodiments may be received in the groove 542. A flat glass shell 580 covers the light-source supporting body 540. Thus, the light of the light-source module 560 may be emitted through the flat glass shell 580. The light-source supporting body 540 may be covered by an additional or a single arc glass shell 585 to further uniformly distribute the light emitted by the light-source module 560.

The power supporting body 514 also includes a groove 516. A plurality of power modules 518 in each of the above embodiments are received in the groove 542. The light-source supporting body 540 is detachably fastened to the power supporting body 514. Therefore, when the light-source module or the power module malfunctions, the light-source module or the power module may be detached individually for maintenance. In addition, since the light-source module and the power module are disposed separately, due to the separation design of light and electricity, the influence between the thermal energy of the light-source module and the power module may be prevented. Note that in an embodiment, the terminal portion 510 of the power supporting body 514 further includes a tube element 512 for installing a supporting rod (not shown in the figure) including a wire.

Figure 5A:
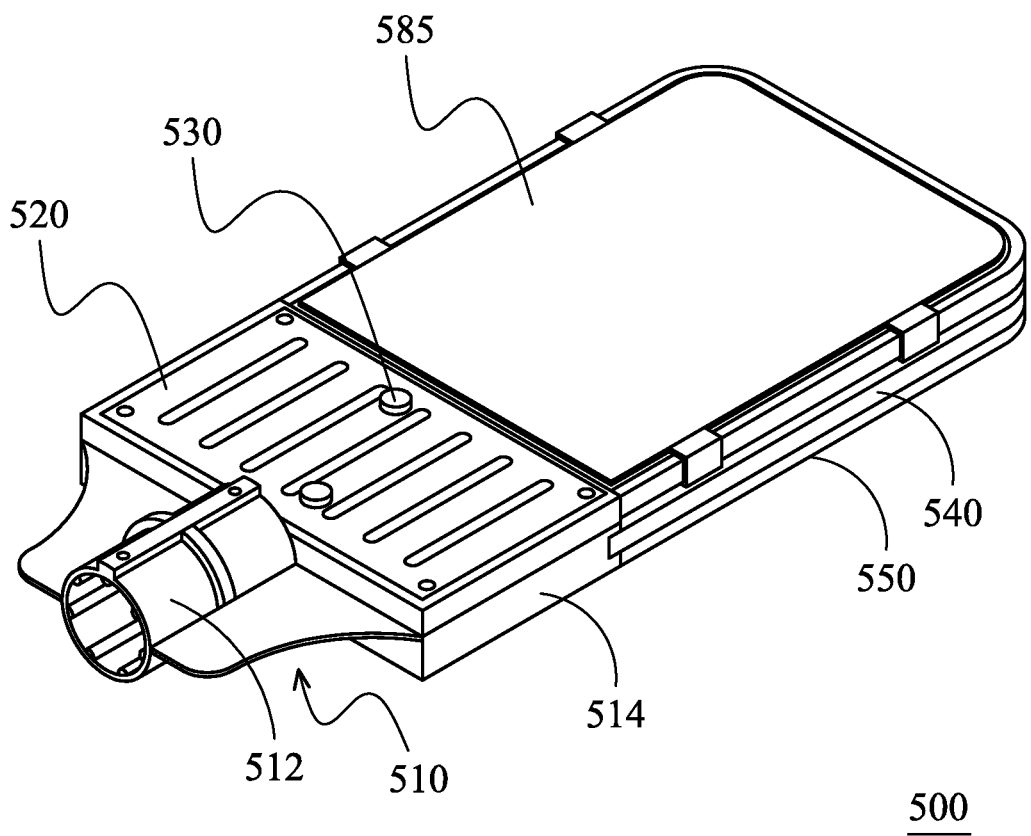
FIGS. 5A-5E are schematic diagrams illustrating an embodiment of an illumination system.
Figure 5B:
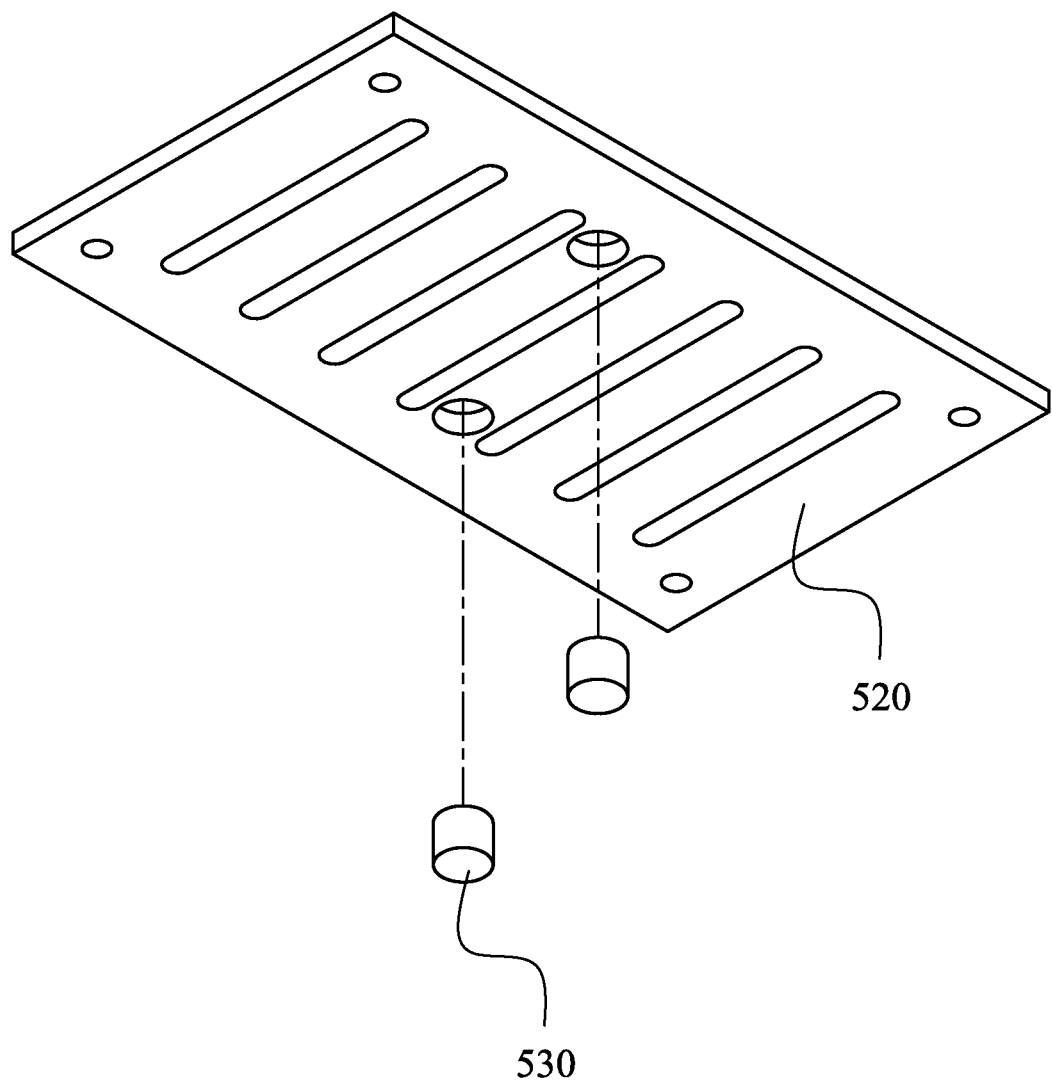
Figure 5C:
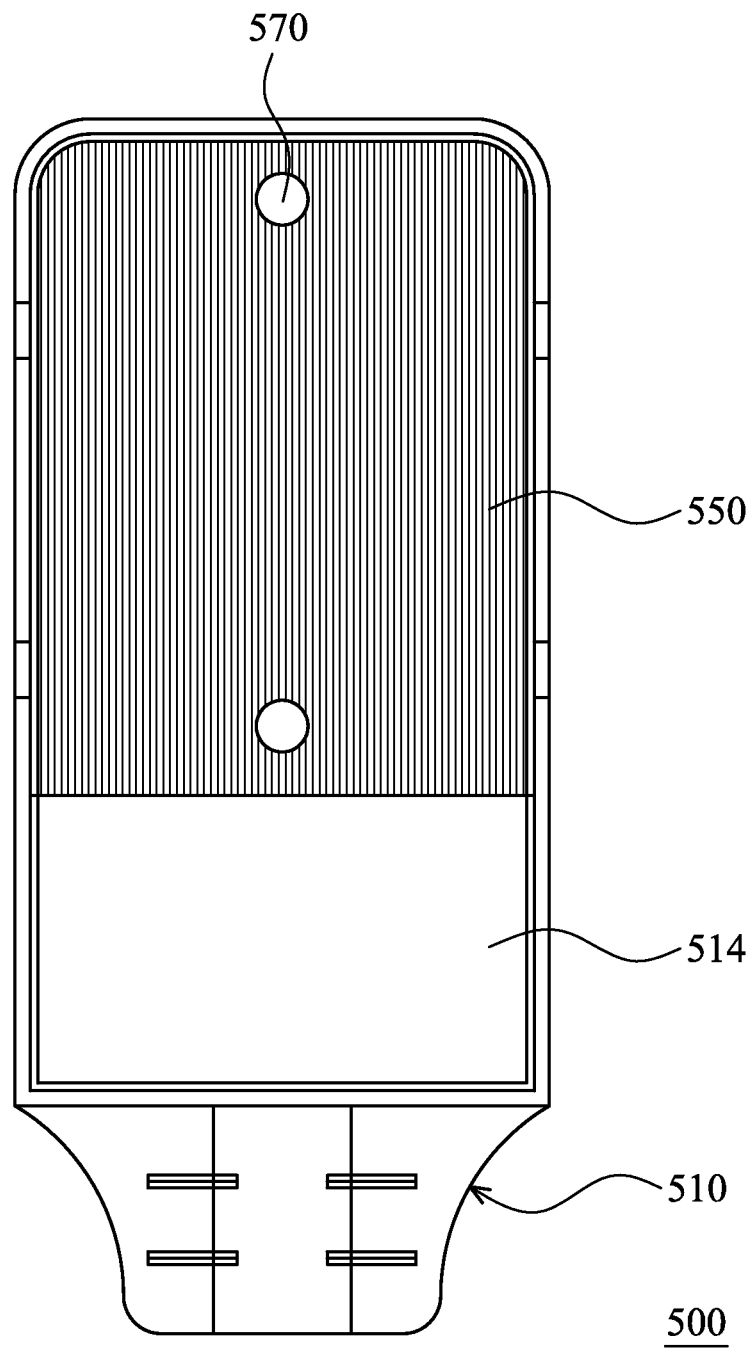
Figure 5D:
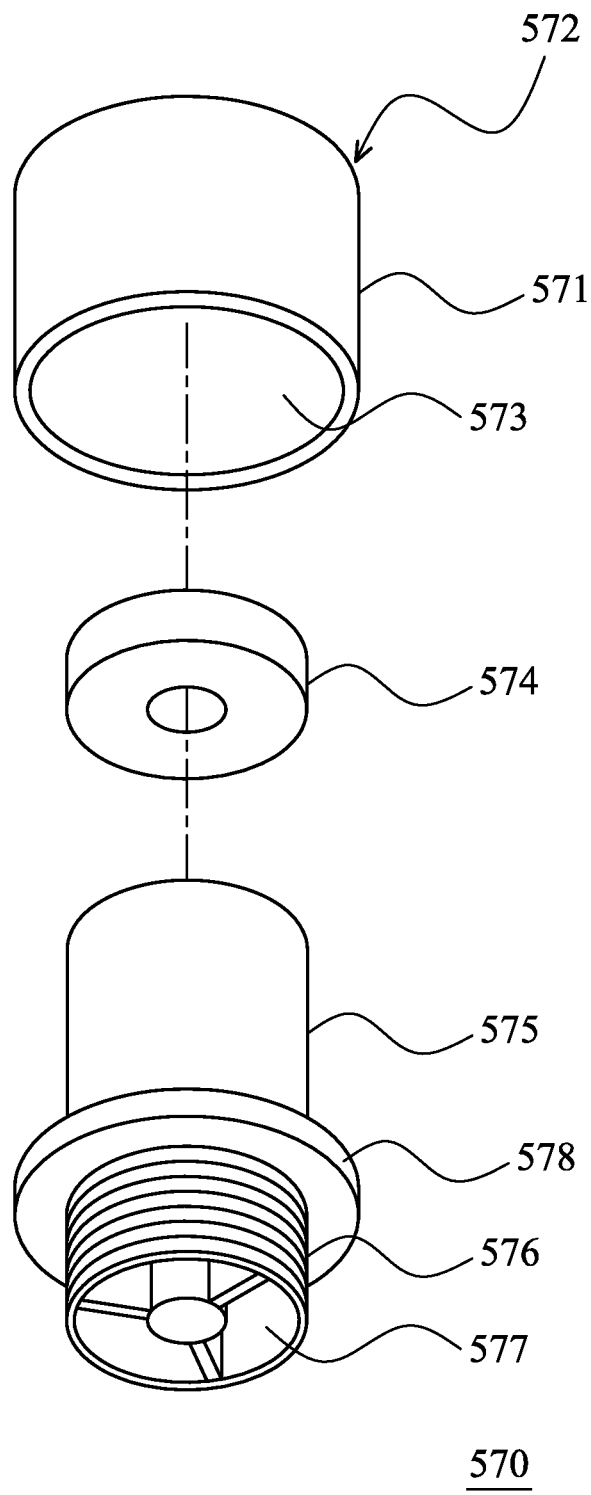
Figure 5E:
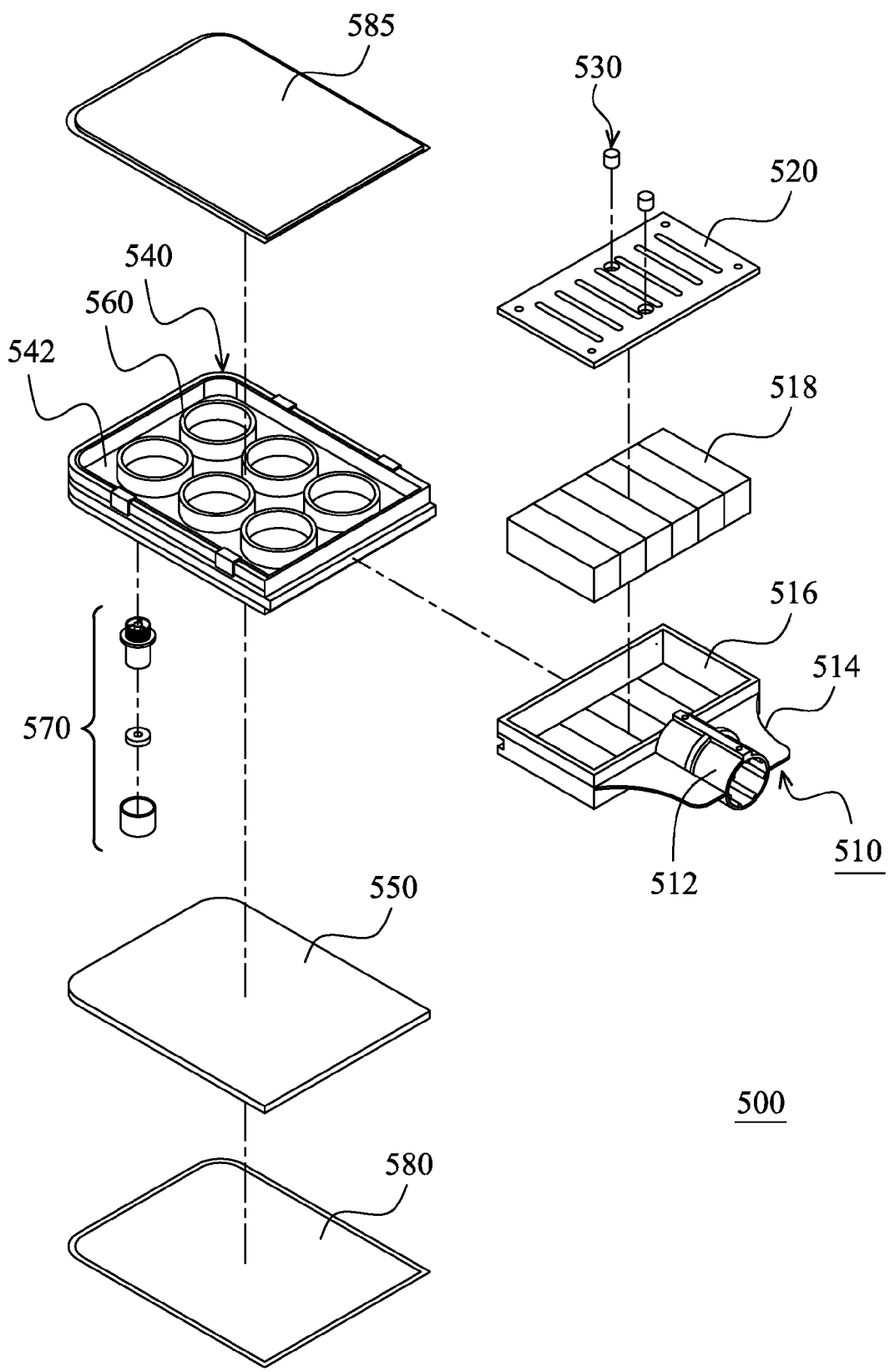

Please refer to FIGS. 5C and 5E. In an embodiment, a dissipation plate, such as a dissipation fin 550, may be disposed on the backside of the light-source supporting body 540. The heat flow generated by the light-source module 560 can be guided to the dissipation fin 550. The heat of the dissipation fin 550 is dissipated by the external air flow. However, since the hot air in the groove 542 of the light-source supporting body 540 is located in an enclosed space, the heat dissipating efficiency is limited. In one embodiment of the invention, a plurality of ventilators 570 is disposed on the dissipation fin 550, and the ventilators 570 are communicated to the groove 542 of light-source supporting body 540. As shown in the FIG. 5D, the ventilator 570 includes a top cap 572. Since the dissipation fin 550 is directly disposed upwardly, to avoid moisture and dust from flowing into the ventilator 570, the top cap 572 is not provided with any hole on the surface.

Moreover, a communicating tube 575 includes one or a plurality of ventilation holes 577. In an embodiment, the bottom of the communicating tube 575 may be fixed to the dissipation fin 550. For example, the communicating tube 575 is locked tightly onto the dissipation fin 550 by the screwed locking device 576 to make the ventilation hole 577 communicate to the groove 542. Further, a baffle plate 578 is used to seal the bottom of the communicating tube 575 more closely. The top of the communicating tube 575 may be covered by a waterproof and ventilating layer 574, such as a multi-layer cotton ventilating filter core. The top cap 572 is disposed around the waterproof and ventilating layer 574 and the communicating tube 575 tightly. In this embodiment, it is noteworthy that the inner diameter of the top cap 572 is wider than the inner diameter of the communicating tube 575. Moreover, the communicating tube 575 is sealed by the waterproof and ventilating layer 574. In an embodiment, the waterproof and ventilating layer 574 is wider than the communicating tube 575, or the inner wall of the top cap 572 is attached by the waterproof and ventilating layer 574. Therefore, the hot air in the groove 542 of the light-source supporting body 540 can be exchanged with the external cold air via the ventilation hole 577 of the communicating tube 575, the waterproof and ventilating layer 574, and a gap between the top cap 572 and the communicating tube 575.

Thus, since most of the moisture and the dust fall downwardly, most will be blocked by the top surface of the top cap 572. Only a few may enter into the gap between the top cap 572 and the communicating tube 575. However, what few enter into the gap between the top cap 572 and the communicating tube 575 can be blocked by the waterproof and ventilating layer 574. Meanwhile, when the moisture and the dust adheres onto the outer surface of the waterproof and ventilating layer 574, since the hot air in the groove 542 of the light-source supporting body 540 pushes outwardly, the moisture and the dust can be pushed away from the waterproof and ventilating layer 574.

Please refer to FIGS. 5B and 5E. In an embodiment, the bottom surface of the power supporting body 510 is covered by a dissipation plate 520. The heat flow generated by the power module 518 can be guided to the dissipation plate 520, and the heat flow may be dissipated by the external air flow. Similarly, since the sealing requirement of the power module 518 is stricter, it is more difficult for the hot air in the groove 516 to dissipate. In one embodiment of the invention, one or a plurality of ventilators 530 communicated to the groove 516 of the dissipation plate 520 is disposed on the bottom surface of the dissipation plate 520. As shown in the FIG. 5B, since the ventilator 530 is disposed downwardly, the dust does not adhere thereto easily. Since the requirement of the power module 518 for the separation of the moisture is stricter, a bubbling stack may be filled in a predetermined hole of the dissipation plate 520 to achieve the object of exchanging heat and to prevent moisture from entering into the power supporting body 510. Note that the structure and the location of the ventilator and the bubbling stack are not limited, and may be changed according to the external environment and different illumination systems.

The above embodiments have the following advantages. In one embodiment, for example, the Light-emitting diode module, which has the multichip package structure, further includes a control chip. The control chip is adjacent to one of the light-emitting chips of the LED array. Two adjacent light-emitting chips or the light-emitting chip and the control chip adjacent thereof are arranged in a rhomboidal shape, or are arranged with side surfaces thereof facing toward the reflector. Therefore, the multichip package structure may prevent light generated by the light-emitting chips from being blocked from other adjacent chips and prevent high thermal radiation from increasing between the side walls of the two chips.

The above embodiments also provide another reflector made from a ceramic body having an enamel surface to prevent the oxidation corrosion phenomenon that easily occurs for the reflectors made from metal materials.

Regarding the circuit design of the multichip package structure, the voltage and the current of multichips may be stabilized by electrically connecting the positive and negative electrodes of the chips, as shown in the FIG. 2A or FIG. 2B, in series or in parallel.

In the embodiment of the light-source module of the alternating current power type, the voltage and the current of each of the light-emitting chips may be stabilized, since the LED array is electrically connected on the circuit board by the multiple series-parallel connections, for example, forming a bridge rectifier circuit, wherein the LED array is arranged in a rhomboidal shape, or side surfaces of each chip of the LED array faces towards the reflector. Moreover, the side wall of each of the light-emitting chips may also form an upward inclined plane to enhance luminous efficiency and reduce heat stack.

In another embodiment, the LED matrix and other passive elements are disposed on the semiconductor substrate by a semiconductor process. Also, the high thermal element and the low thermal element may be disposed, respectively, on composite carrying plates having different thermal conductivities.

In addition, in one embodiment, the pluggable power receiving portion and the detachable light-source module are separately disposed. Therefore, they may be maintained and detached easily. Also, the light-source module will not be influenced easily by the heat flow generated by the power module.

Moreover, in another embodiment, the hot air in the light-source supporting body 540 and the power supporting body 514 can be guided by each ventilating and dissipating structure, which are communicated to each other, of the grooves, so that thermal convection can be generated.

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. An illumination system characterized by comprising:
a light-source supporting body having a first groove to receive at least one light-source module;
a power supporting body having a second groove to receive at least one power module,
wherein the light-source supporting body is detachably disposed on the power supporting body, and each of the light-source modules comprises a multichip package structure composed of a plurality of light-emitting chips, and each of the light-source modules and the power modules are separated by the light-source supporting body and the power supporting body;
a reflector surrounding the light-emitting chips; and
a control chip adjacent to one of the light-emitting chips, wherein the two adjacent light-emitting chips or the light-emitting chip and the control chip adjacent thereof are arranged in a rhomboidal shape, or are arranged with side surfaces thereof facing to the reflector.

2. The illumination system as claimed in claim 1, characterized in that the light-source supporting body further comprises a first dissipation plate disposed on a top surface thereof, and the power supporting body further comprises a second dissipation plate disposed on a bottom surface thereof.

3. The illumination system as claimed in claim 2, characterized in that each of the first dissipation plate and the second dissipation plate further comprises a ventilator connected respectively to the first groove of the light-source supporting body and the second groove of the power supporting body.

4. The illumination system as claimed in claim 1, characterized in that the reflector is made from a ceramic body having an enamel surface.

5. The illumination system as claimed in claim 1, characterized in that a side wall of each of the light-emitting chips is an upward inclined plane.

6. The illumination system as claimed in claim 1, characterized in that the multichip package structure further comprises a high thermal element and a low thermal element, and a composition carrying plate having different thermal conductivities, wherein the high thermal element and the low thermal element are respectively disposed on the composition carrying plate.

7. The illumination system as claimed in claim 6, characterized in that the high thermal element is disposed on an alumina substrate or a silicon substrate, the low thermal element is disposed on a printed circuit board, and the alumina substrate or the silicon substrate is embedded on the printed circuit board to form the composition carrying plate.

8. A manufacturing method of a multichip package structure for a light emitting diode, characterized by comprising:
providing a silicon substrate comprising a light-emitting chip carrying section and a passive component carrying section;
forming an insulation layer on the silicon substrate;
forming a patterned conducting layer on the light-emitting chip carrying section;
attaching the passive component or forming the passive component by a semiconductor process on the passive component carrying section;
electrically connecting each of the light-emitting chips arranged in a rhomboidal shape to the patterned conducting layer and the passive component to form a direct current power type or an alternating current power type package structure;
providing a reflector surrounding the light-emitting chips; and
providing a control chip adjacent to one of the light-emitting chips, wherein the two adjacent light-emitting chips or the light-emitting chip and the control chip adjacent thereof are arranged in a rhomboidal shape, or are arranged with side surfaces thereof facing to the reflector.

9. The manufacturing method of a multichip package structure for a light emitting diode as claimed in claim 8, characterized in that the passive component comprises a capacitor, a resistor, an inductance, a filter component, or a stabilizing component.

10. A manufacturing method of a multichip package structure for a light emitting diode, characterized by comprising:
providing a silicon substrate comprising a light-emitting chip carrying section and a passive component carrying section;
forming an insulation layer on the silicon substrate;
forming a patterned conducting layer on the light-emitting chip carrying section;
attaching the passive component or forming the passive component by a semiconductor process on the passive component carrying section; and
electrically connecting each of the light-emitting chips arranged in a rhomboidal shape to the conductive pattern and the passive component to form a direct current power type or an alternating current power type package structure; and
providing a reflector surrounding the light-emitting chips, wherein the light-emitting chips are arranged so that sides of the light-emitting chips facing towards the reflector.

11. The manufacturing method of a multichip package structure for a light emitting diode as claimed in claim 10, characterized in that the light-emitting chips of the light-source module are arranged in a matrix composed of a plurality of columns and rows, wherein each of the light-emitting chips in each one of the columns are electrically connected to each other in parallel, and each of the light-emitting chips in each one of the rows are electrically connected to each other in series.

12. The manufacturing method of a multichip package structure for a light emitting diode as claimed in claim 11, characterized in that the light-emitting chips are arranged to form an equivalent bridge rectifier circuit device.

* * * * *